United States Patent
Samuels

(10) Patent No.: US 12,300,464 B2
(45) Date of Patent: May 13, 2025

(54) ROBUST TENSORIZED SHAPED SETPOINT WAVEFORM STREAMING CONTROL

(71) Applicant: Advanced Energy Industries, Inc., Fort Collins, CO (US)

(72) Inventor: Chad S. Samuels, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 415 days.

(21) Appl. No.: 17/509,539

(22) Filed: Oct. 25, 2021

(65) Prior Publication Data

US 2023/0125521 A1 Apr. 27, 2023

(51) Int. Cl.
*H01J 37/32* (2006.01)

(52) U.S. Cl.
CPC .. *H01J 37/32155* (2013.01); *H01J 37/32174* (2013.01)

(58) Field of Classification Search
CPC .......... H01J 37/32146; H01J 37/32155; H01J 37/32174; H01J 37/32183; H01J 37/32926

See application file for complete search history.

(56) References Cited

U.S. PATENT DOCUMENTS

| | | | |
|---|---|---|---|
| 8,040,068 B2 | 10/2011 | Coumou | |
| 8,258,874 B2 | 9/2012 | van Zyl | |
| 8,716,984 B2 | 5/2014 | Mueller | |
| 8,912,835 B2 | 12/2014 | Nagarkatti | |
| 9,225,299 B2 | 12/2015 | van Zyl | |
| 9,509,266 B2 * | 11/2016 | Coumou | .................. H03G 1/00 |
| 9,721,758 B2 | 8/2017 | Coumou | |
| 10,049,857 B2 | 8/2018 | Fisk, II | |
| 10,546,724 B2 * | 1/2020 | Radomski | ......... H01J 37/32091 |
| 10,861,677 B2 * | 12/2020 | Van Zyl | ............ H01J 37/32174 |
| 11,042,140 B2 | 6/2021 | Coumou et al. | |
| 2008/0216956 A1 * | 9/2008 | Nakamoto | ......... G01B 11/0625 |
| | | | 156/345.25 |
| 2012/0132397 A1 * | 5/2012 | Silveira | ............. H01J 37/32926 |
| | | | 118/712 |
| 2014/0249674 A1 * | 9/2014 | Kodama | ................ B25J 9/1664 |
| | | | 700/246 |
| 2019/0286632 A1 * | 9/2019 | Okuyama | ........... G06F 16/2462 |
| 2019/0333738 A1 | 10/2019 | Coumou et al. | |

(Continued)

OTHER PUBLICATIONS

Shane Thomas, International Search Report, Apr. 10, 2023, Commissioner for Patents, Alexandria, Virginia.

(Continued)

*Primary Examiner* — Tung X Le
(74) *Attorney, Agent, or Firm* — NOD Law PC

(57) ABSTRACT

Various illustrative aspects are directed to a system. The system comprises a setpoint waveform streaming progenitor module, configured to receive inputs indicative of a desired setpoint waveform, and to output a data package based at least in part on the inputs indicative of the desired setpoint waveform, wherein the data package comprises a plurality of points, an interpolation method, and one or more interpolation parameters. The system further comprises a setpoint waveform streaming processing module, configured to receive the data package from the setpoint waveform streaming progenitor module, and to output a streaming setpoint waveform based at least in part on the data package.

20 Claims, 8 Drawing Sheets

(56) References Cited

U.S. PATENT DOCUMENTS

| | | | |
|---|---|---|---|
| 2019/0355557 A1* | 11/2019 | Moriya | G01S 17/06 |
| 2023/0041177 A1* | 2/2023 | Smyka | H01J 37/32146 |
| 2023/0215694 A1* | 7/2023 | Marakhtanov | H03K 3/37 |

OTHER PUBLICATIONS

PCT, International Preliminary Report on Patentability issued in PCT/US2022/047059, May 10, 2024, 8 pages.

* cited by examiner

ROBUST TENSORIZED SHAPED SETPOINT WAVEFORM STREAMING CONTROL

TECHNICAL FIELD

Aspects of the present disclosure relate generally to control systems, including control systems for radio frequency (RF) generators.

BACKGROUND

Control systems have important applications in many technology areas, including plasma applications, semiconductor processing and other materials processing, robotics, vehicle control systems for automobiles, aircraft, and spacecraft, and other electronic, manufacturing, and industrial systems. Semiconductor processing and other advanced materials processing rely on increasingly sophisticated plasma processes. Such plasma processes, in turn, require increasingly sophisticated power systems and control systems, to subject inherently unstable and nonlinear plasmas to increasing precision and consistency. Such plasmas are used for processes such as plasma etch processes, plasma-enhanced chemical vapor deposition (CEPVD) processes, plasma-enhanced atomic layer deposition (PEALD) processes, plasma-assisted atomic-layer deposition (PA-ALD), RF sputtering deposition, and other plasma applications.

After substantial technological progress, one typical plasma power and control system may comprise an inductively coupled plasma (ICP) reactor, powered by an RF generator connected through an RF impedance match network, and accompanied by measurement equipment that detects signals and physical states from the match network and the plasma reactor and feeds that data to the RF generator. The match network implements rapid, high-precision matching of the rapidly changing, chaotic, nonlinear impedance of the plasma, to protect the RF generator from the otherwise deleterious effects of those rapid, nonlinear impedance changes. The RF generator amplifies and converts electrical power from a basic input form into a form optimized to power the plasma. The RF generator comprises an RF power amplifier, a user interface, and a controller, such as a measurement and control multi-processor system on chip (M&C MPSoC), which controls the RF generator.

SUMMARY

Various aspects disclosed herein provide novel setpoint waveform streaming systems, devices, and methods that may enable and provide robust shaped setpoint waveform streaming control, and novel processors, controllers, RF generators, systems, devices, and methods that incorporate such novel setpoint waveform streaming systems, devices, and methods. Various novel systems of this disclosure may extend the concept of a setpoint modifier to setpoint waveform streaming that provides effectively instantaneous or realtime control, instead of averaged control, or control signals that are based on quantities averaged over time, among other novel and inventive systems, devices, and methods.

Various illustrative aspects are directed to a system. The system comprises a setpoint waveform streaming progenitor module, configured to receive inputs indicative of a desired setpoint waveform, and to output a data package based at least in part on the inputs indicative of the desired setpoint waveform, wherein the data package comprises a plurality of points, an interpolation method, and one or more interpolation parameters. The system further comprises a setpoint waveform streaming processing module, configured to receive the data package from the setpoint waveform streaming progenitor module, and to output a streaming setpoint waveform based at least in part on the data package.

Various illustrative aspects are directed to a method. The method comprises receiving, by one or more processors, inputs indicative of a desired setpoint waveform. The method further comprises generating, by the one or more processors, a data package based at least in part on the inputs indicative of the desired setpoint waveform, wherein the data package comprises a plurality of points, an interpolation method, and one or more interpolation parameters. The method further comprises generating, by the one or more processors, a setpoint waveform based at least in part on the data package.

Various illustrative aspects are directed to a computing system. The computing system comprises one or more processing devices, one or more tangible computer-readable memory devices, and one or more tangible computer-readable data storage devices. The computing system further comprises program instructions, stored on the one or more data storage devices for execution by the one or more processing devices using the one or more memory devices, for receiving inputs indicative of a desired setpoint waveform. The computing system further comprises program instructions, stored on the one or more data storage devices for execution by the one or more processing devices using the one or more memory devices, for generating a data package based at least in part on the inputs indicative of the desired setpoint waveform, wherein the data package comprises a plurality of points, an interpolation method, and one or more interpolation parameters. The computing system further comprises program instructions, stored on the one or more data storage devices for execution by the one or more processing devices using the one or more memory devices, for generating a setpoint waveform based at least in part on the data package.

Various further aspects are depicted in the accompanying figures and described below, and will be further apparent based thereon. Throughout this disclosure, the term "system," where not otherwise specified, may generically be used to refer to or incorporate a system, a device, a method, a process, an apparatus, a technique, or another potentially inventive category. Referring nevertheless to "systems, devices, and methods" or the like does not negate or affect this intended generic meaning of the term "system."

BRIEF DESCRIPTION OF THE DRAWINGS

Various features and advantages of the technology of the present disclosure will be apparent from the following description of particular embodiments of those technologies, and as illustrated in the accompanying drawings. The drawings are not necessarily to scale; the emphasis instead is placed on illustrating the principles of the technological concepts. In the drawings, like reference characters may refer to the same parts throughout the different views. The drawings depict only illustrative embodiments of the present disclosure and, therefore, are not to be considered limiting in scope.

DETAILED DESCRIPTION

Figure 1:
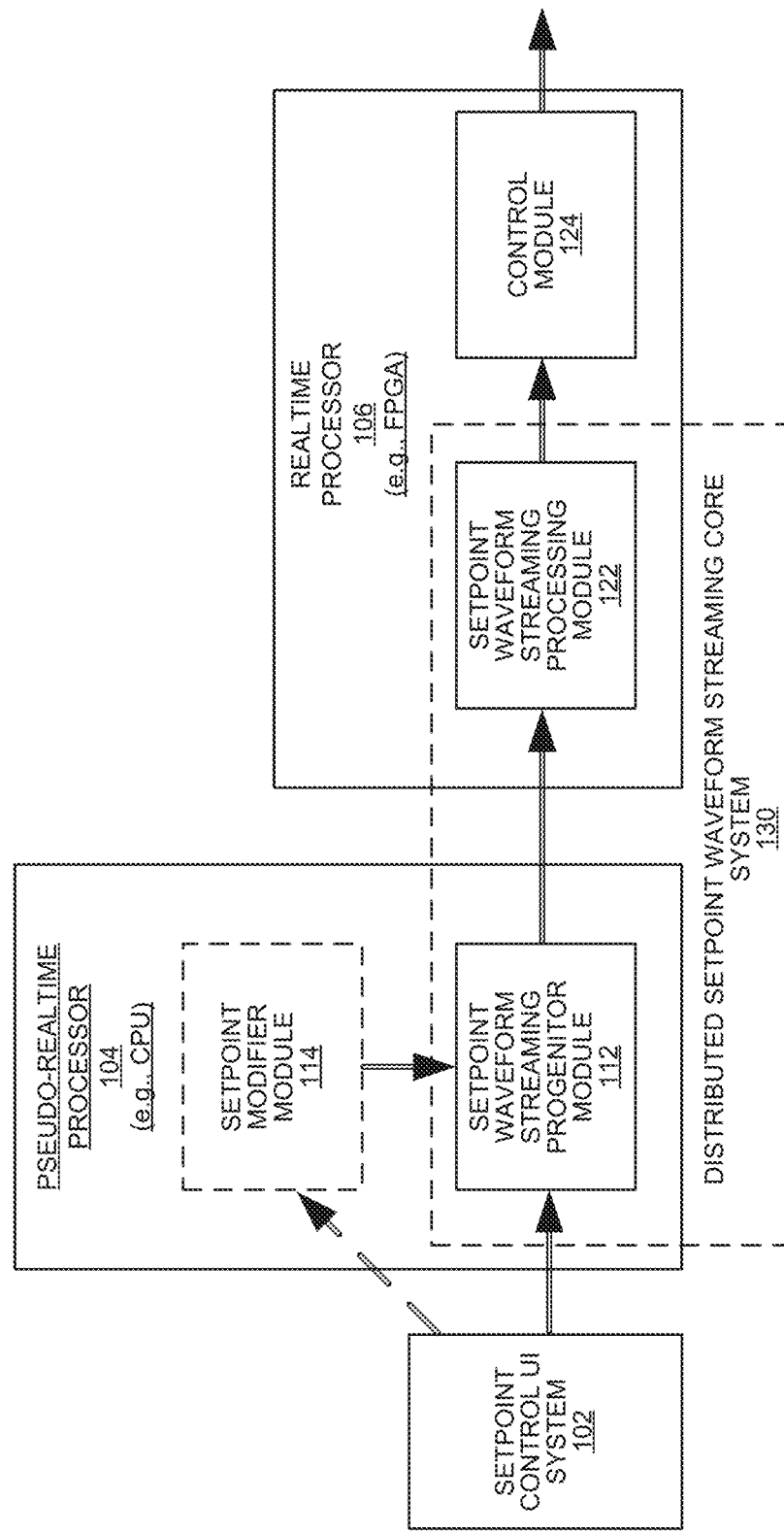
FIG. 1 illustrates a conceptual block diagram of a setpoint waveform streaming system, in accordance with aspects of the present disclosure.

Aspects of the present disclosure may novel setpoint waveform streaming systems, devices, and methods that may enable and provide robust shaped setpoint waveform streaming control, and novel control systems, devices, and methods that incorporate such novel setpoint systems, devices, and methods. Various novel systems of this disclosure may extend the concept of a setpoint modifier to setpoint waveform streaming that provides effectively instantaneous or realtime control, instead of averaged control, or control signals that are based on quantities averaged over time. For purposes of this disclosure, and in context of the understanding of persons skilled in the relevant fields of art, "effectively instantaneous" or "realtime" may refer to time scales that are very short relative to the typical time scales of physical phenomena typical of a system, apparatus, machine, or environment to be controlled by a control system, in various examples—such as a plasma processing chamber, in some examples, in which a plasma to be controlled may typically exhibit nonlinear and even chaotic behavior, with rapid changes on very short time scales. Setpoint streaming systems of this disclosure may be used sequentially, in parallel, or independently of setpoint modifier adaptive nonlinear processing and/or filtering, which are the subject of another patent application of the present Assignee under preparation in parallel with the present one.

Setpoint waveform streaming systems of this disclosure may offload computationally intensive pseudo-realtime operations to a relatively slower CPU, and may narrow operations on an FPGA to substantially or only realtime operations, in various examples, thus enabling more available processing capacity and extending the life of an SoC and/or an FPGA/CPU system, which may then be more fully devoted to next generation control. A setpoint streaming system of this disclosure may thus achieve new breakthroughs in performance, without requiring re-designing or modifying a control system to incorporate more expensive, high-performance hardware features.

Setpoint waveform streaming systems of this disclosure may help enable a distributed, modular architecture of a control system, and may help enable incorporation also into a control system, and serve as a potential stepping stone and building block, of a novel tensor signal processing unit (TSPU) and its dataflow, which are the subject of another patent application of the present Assignee under preparation in parallel with the present one.

Setpoint waveform streaming systems of this disclosure may generalize the concept of a "reference model" to a more generalized concept of an arbitrarily shaped, trackable, reference setpoint waveform, which may benefit from the repetitive nature of power waveforms on plasmas. Setpoint streaming systems of this disclosure may enable adaptive controls to be much more robust and stable, including when operating in strongly nonlinear and chaotic loads. Setpoint streaming systems of this disclosure may thus provide tremendous advantages over prior art systems that rely on the old MIT-MRAC rule (Massachusetts Institute of Technology-Model Reference Adaptive Control rule), including those with feedforward, adaptation rate lookup, and a single-input single-output (SISO) transfer function, in which the more nonlinear a system to be controlled becomes, the more delayed and brittle the control system's performance becomes, and the higher the chance the control system has of hitting limits, going unstable, and destroying its hardware.

FIG. 1 illustrates a conceptual block diagram of a setpoint waveform streaming system 100, in accordance with aspects of the present disclosure. Setpoint waveform streaming system 100 comprises setpoint streaming user interface (UI) system (SSUIS) 102, a pseudo-realtime processor 104 (e.g., a CPU), and a realtime processor 106 (e.g., an FPGA). For purposes of this description, the term "realtime" may be generally interpreted as is familiar in the applicable arts, and may include applicability to a processor routinely capable of processing instructions and reacting to inputs with reaction times typical of an FPGA, in some examples, while the term "pseudo-realtime" may include applicability to a processor routinely capable of processing instructions and reacting to inputs with reaction times typical of a CPU, in some examples. Pseudo-realtime processor 104 comprises a setpoint waveform streaming progenitor module 112 configured and/or executing thereon, and may optionally also include a setpoint modifier 114 configured and/or executing thereon. Realtime processor 106 comprises a setpoint waveform streaming processing module 122 and a control module 124 configured and/or executing thereon.

Setpoint control UI system 102 may comprise a computer or any other device capable of executing a setpoint control UI and enabling a user to enter user inputs indicative of a desired setpoint waveform to the setpoint control UI. The setpoint control UI may interact with a setpoint control application that may execute at least in part on the same one or more devices as setpoint control UI system 102, in the cloud, and/or any other accessible computing resources.

Setpoint waveform streaming progenitor module 112 and setpoint waveform streaming processing module 122 may together form, and together be considered as, a distributed setpoint waveform streaming core system 130. Different components, functions, and/or aspects of distributed setpoint waveform streaming core system 130 may be distributed in different ways across setpoint waveform streaming progenitor module 112 and setpoint waveform streaming processing module 122, and across pseudo-realtime processor 104, realtime processor 106, and/or additional processors, devices, or components, in various examples. In various examples, distributed setpoint waveform streaming core system 130 may perform, execute, and/or embody inventive aspects of the present disclosure, by and in itself, and independently of any other components or aspects of setpoint waveform streaming system 100 as shown in FIG. 1. In some examples, distributed setpoint waveform streaming core system 130 may be incorporated in a single controller, which may incorporate pseudo-realtime processor 104 and realtime processor 106 as integral components, as further described below.

Setpoint streaming UI system 102 may enable users or systems to enter inputs, may process those inputs for delivery to setpoint waveform streaming progenitor module 112, and may output those processed inputs to setpoint waveform streaming progenitor module 112. Setpoint modifier 114 may output setpoint modifier outputs to setpoint streaming progenitor module 112. Setpoint waveform streaming progenitor module 112 may generate a tensorized seed waveform, and corresponding waveform parameters, based at least in part on the processed user inputs, and in some examples, also at least in part on the setpoint modifier signals. That is, setpoint waveform streaming progenitor module 112 may encode all of the data for a seed waveform in the form of a tensor, which may be advantageously and rapidly processed by setpoint waveform streaming processing module 122. Setpoint waveform streaming progenitor module 112 may output the tensorized seed waveform and corresponding parameters to setpoint waveform streaming processing module 122 on realtime processor 106. Setpoint waveform streaming processing module 122 may receive outputs from setpoint waveform streaming progenitor module 112, such as tensorized setpoint waveform signals indicative of setpoint waveform streaming progenitors, and may use and process data from the outputs to generate and output complete setpoint waveforms ready for streaming.

Control module 124 may comprise an MRAC (model reference adaptive control) control module, a PID (proportional-integral-derivative) control module comprising one or more PID modules, a gain parametrized control module, or another type of control module, in different examples. Control module 124 may receive the setpoint waveforms streaming from setpoint waveform streaming processing module 122, and may also receive other inputs such as error signals and system sensor readings. Control module 124 may apply intermediate operations such as error correction, if and when control module 124 determines a need to perform such an action. Control module may generate and output a control signal based at least in part on the streaming setpoint waveform outputted by setpoint waveform streaming processing module 122.

Setpoint waveform streaming system 100, via setpoint control UI system 102, enables a user to input a desired shape of an output power waveform for a plasma in a plasma reactor or other type of plasma chamber. Setpoint waveform streaming system 100 may enable the setpoint waveform to be of any shape and type, with very high resolution, such as up to eight times (8×) the sampling rate of realtime processor 106 (e.g., and FPGA), in some examples. In one example, realtime processor 106 may comprise an FPGA with a sampling speed of 100 megahertz (MHz), and the resolution of the setpoint waveform enabled by setpoint waveform streaming system 100 may be 12.5 MHz. In another example of setpoint waveform streaming system 100 incorporated into another example RF generator, the resolution of the setpoint waveform enabled by setpoint waveform streaming system 100 may be 100 MHz.

Setpoint waveform streaming system 100 may enable a user to simply input desired multi-level pulsing setpoints or multi-state setpoints with desired waveform shape and timing specifications for each state, via setpoint control UI system 102, and setpoint waveform streaming system 100 may produce or generate or transmit a setpoint waveform with the multiple pulsing levels or states and in accordance with the other desired waveform shape and timing specifications for each pulsing level or state, in various examples. While some traditional example plasma processing systems, as an example application for setpoint waveform streaming system 100, have requirements for one or two states or one or two level pulsing in a setpoint signal provided to a control module of a controller for the plasma processing system, some emerging example systems may have a requirement for four states or four level pulsing, which setpoint waveform streaming system 100 may accommodate, thereby providing novel advantages in being able to meet requirements for up to four states. Setpoint waveform streaming system 100 may also, in some examples, be upgradeable or upgraded to be able to provide, for example, up to eight or sixteen states, with a simple software parameter upgrade, with the same hardware. Setpoint waveform streaming system 100 may also be capable of providing more than sixteen states or other numbers of states, in other examples. Setpoint waveform streaming system 100 may use setpoint streaming with multiple desired inputs and multiple desired outputs as part of the desired setpoint waveform, and produce a corresponding multi-input multi-output (MIMO) setpoint waveform, as an intrinsic feature of its tensorized nature.

Figure 2:
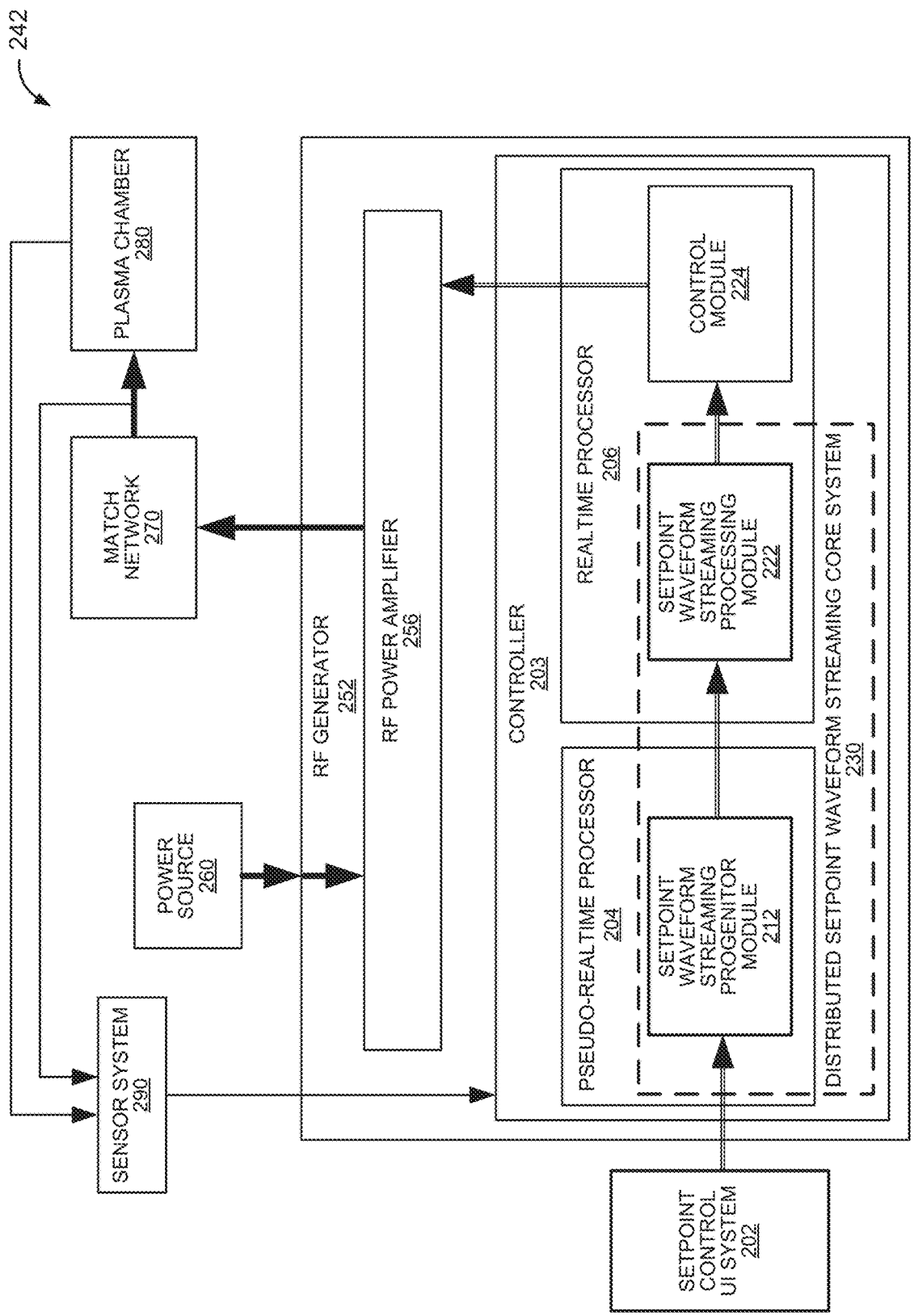
FIG. 2 illustrates a conceptual block diagram of an example plasma processing environment incorporating a setpoint waveform streaming system, in accordance with aspects of the present disclosure.

FIG. 2 shows a conceptual block diagram of an example plasma processing environment 242 incorporating a setpoint waveform streaming system of this disclosure. In particular, plasma processing environment 242 comprises an RF generator 252 which incorporates an RF power amplifier 256 and a controller 203. Controller 203 comprises distributed setpoint waveform streaming core system 230. Plasma processing environment 242 further comprises power source 260, match network 270, plasma chamber 280, and sensor system 290, in this example. Various examples of distributed setpoint waveform streaming core system 230 may comprise and/or function as examples of a setpoint waveform streaming system of this disclosure.

Plasma processing environment 242 shows an example application context in which various example setpoint waveform streaming systems of this disclosure may provide novel advantages. In various examples, controller 203 may be configured to implement distributed setpoint waveform streaming core system 230 to generate and output control signals based at least in part on setpoint waveform streaming, as presented in this disclosure, and to output those control signals to drive RF power amplifier 256, thereby to control RF power outputted by RF power amplifier 256 to the RF load comprising match network 270 and plasma chamber 280.

Controller 203 incorporates pseudo-realtime processor 204 and realtime processor 206, which are operably connected together, and which together comprise distributed setpoint waveform streaming core system 230. Pseudo-realtime processor 204 may be, e.g., a CPU in some examples, and realtime processor 206 may be, e.g., an FPGA in some examples. Pseudo-realtime processor 204 and realtime processor 206 may be comprised in a single, integrated processing chip, together with integrated interconnecting communication channels or fabric, in some examples. Pseudo-realtime processor 204 of controller 203 comprises setpoint waveform streaming progenitor module 212, such as in the form of computer-executable software instructions loaded and/or executing thereon and/or configured to be executing thereon. Realtime processor 206 of controller 203 comprises setpoint waveform streaming processing module 222, such as in the form of computer-executable software instructions loaded and/or executing thereon and/or configured to be executing thereon. Setpoint waveform streaming progenitor module 212 is configured to send, deliver, or transmit outputs to setpoint waveform streaming processing module 222. Setpoint waveform streaming processing module 222 is configured to receive inputs, signals, or transmissions from setpoint waveform streaming progenitor module 212. Setpoint waveform streaming progenitor module 212 and setpoint waveform streaming processing module 222 together form or are comprised in distributed setpoint waveform streaming core system 230.

Controller 203 also comprises control module 224, configured to receive inputs from setpoint waveform streaming processing module 222 and to generate and output control signals to RF power amplifier 256, to drive the RF load, including match network 270 and plasma chamber 280. Controller 203 is also operably connected to setpoint control UI system 202, for setpoint waveform streaming progenitor module 212 to receive inputs from setpoint control UI system 202, including user inputs specifying or designating waveform shapes, waveform pulsing level shapes or state shapes, points, waveform parameters, and/or other data or information indicative of one or more desired setpoint waveforms.

Figure 3:
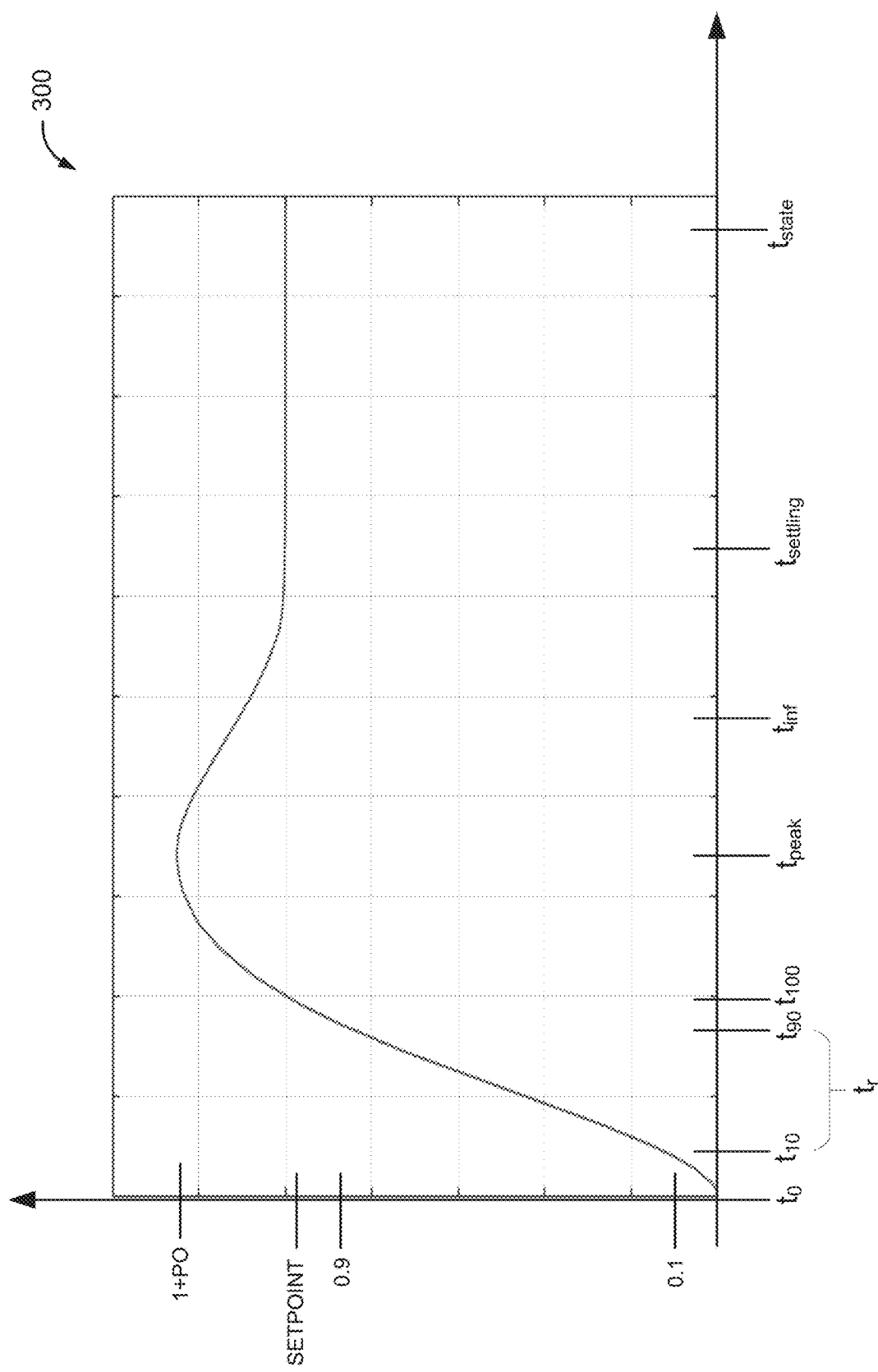
FIG. 3 shows a graph of amplitude over time for a single example setpoint waveform 300 for a single state or pulsing level, in accordance with aspects of the present disclosure.

FIG. 3 shows a graph of amplitude over time for a single example setpoint waveform 300 for a single state or pulsing level, in accordance with aspects of the present disclosure. Setpoint waveform 300 may be extendable to multiple setpoint waveforms and/or setpoint waveform states or pulsing levels concurrently. Setpoint waveform streaming system 100 may enable a user to input data, parameters, and/or information indicative of a desired setpoint waveform, such as example desired setpoint waveform 300 as shown in FIG. 3. Setpoint waveform streaming system 100 may enable a user to set every parameter for a desired setpoint waveform, such as example desired setpoint waveform 300, and for every state of the desired setpoint waveform, in examples of waveforms comprising multiple states. For example, setpoint waveform streaming system 100 may enable a user to input each of the following waveform parameters indicative of a desired setpoint waveform (examples of which for example setpoint waveform 300 are indicated in FIG. 3):

setpoint percentage overshoot (PO)—a percentage of the setpoint by which the setpoint waveform overshoots the setpoint (i.e., peaks at amplitude of 1+PO) on its initial rise starting time ($t_0$)—the time the setpoint waveform starts 10% time ($t_{10}$)—the time after the starting time $t_0$ at which the setpoint waveform first reaches 10% of the setpoint 90% time ($t_{90}$)—the time after the starting time $t_0$ at which the setpoint waveform first reaches 90% of the setpoint rise time ($t_r$)—may be defined, for example, as the duration of time between when the setpoint waveform has risen from 10% of the setpoint ($t_{10}$) to when the setpoint waveform has risen to 90% of the setpoint ($t_{90}$)

overshoot time ($t_{100}$)—the time after the starting time $t_0$ at which the setpoint waveform first reaches the setpoint (100% of the value of the setpoint) and begins its overshoot above the setpoint (in setpoint waveforms in which such an overshoot is applicable)

peak time ($t_{peak}$)—the time after the starting time $t_0$ at which the setpoint waveform reaches its peak, i.e., its setpoint plus its percentage overshoot inflection point time ($t_{inf}$)—the time after the starting time $t_0$ at which the setpoint waveform hits its inflection point from its peak toward settling to the setpoint, i.e., the time after the peak at which the setpoint waveform goes from convex to concave settling time ($t_{settle}$)—the time after the starting time $t_0$ at which the setpoint waveform reaches and settles to the setpoint, and from which remains at the setpoint, until a subsequent time of leaving that setpoint (not shown in FIG. 2)

state time ($t_{state}$)—the time after the starting time $t_0$ at which the setpoint waveform finishes a particular state These are merely illustrative examples of setpoint waveform parameters that may be accepted as user inputs indicative of a desired waveform by a setpoint waveform streaming system of this disclosure, and used by a setpoint waveform streaming system of this disclosure to generate and output a streaming setpoint waveform that corresponds and adheres to the waveform parameters, and/or any other data or information indicative of the desired setpoint waveform as indicated by the received user inputs. A setpoint waveform streaming system of this disclosure may also be configured to receive and process any other mathematically defined parameters, data, or information that may be used to help specify or define a waveform, in other examples.

The term "setpoint waveform" may refer to an entire waveform including and surrounding an amplitude delivered at a desired constant setpoint itself. A setpoint waveform may thus may include a rise, an overshoot, a post-setpoint descent, and any other, potentially arbitrary waveform components, waveform segments, waveform states, waveform pulsing levels, or any other elements that a user may conceive or imagine to include in a desired setpoint waveform, in addition to a state, portion, or segment of a setpoint waveform in which the setpoint waveform is set to a constant amplitude at a constant setpoint itself.

In some examples, the received user data may specify a setpoint waveform comprising multiple states, such as two or more states or pulsing levels in a sequence in the setpoint waveform. In some examples, setpoint waveform streaming system 100—e.g., setpoint waveform streaming progenitor module 112 of setpoint waveform streaming system 100—may stitch together a full setpoint waveform by combining all of a number of subsidiary waveform states together, as indicated by user inputs received via setpoint control UI system 102. Setpoint waveform streaming progenitor module 112 may, for each state and for each point in time within each state or within the waveform, use a normalized amplitude for level normalized waveforms, and use a scale factor that enables the iterative use of a setpoint of a previous state as a starting amplitude for a current state. As may be applicable in some examples, this is shown in Equation 1:

$$P_{setpoint}(state_k) = (P_{setpoint_k} - P_{setpoint_{k-1}}) * P_{norm} * f_{scale} + P_{setpoint_{k-1}}$$ (Equation 1)

where $P_{setpoint}(state_k)$ is the starting setpoint amplitude for a new state at a point in time k, $P_{setpoint_k}$ is the setpoint amplitude of the previous state at time k, $P_{setpoint_{k-1}}$, is the setpoint amplitude of the previous state at time k−1 at a point in time prior to time k (e.g., by one increment in the clock speed at which the waveform is being processed), $P_{norm}$ is the normalized amplitude, and $F_{scale}$ is the scale factor. The value of P at the start of a new state k may be the same as the value of P at the finish of the previous state k−1. In other examples, a waveform streaming progenitor module comparable in some ways to setpoint waveform streaming progenitor module 112 may implement an analogous equation but with values of P other than setpoint values, for example.

Setpoint waveform streaming progenitor module 112 may obtain the timing for each state, relative to a starting time, from the normalized waveform, and taking into account the scale factor, which enables a time waveform for a state to connect seamlessly with time waveforms for other states. This is shown in Equation 2, for some examples:

$$t(\text{state}_k) = (t_{\text{state}_k} - t_{\text{start}_k}) * t_{norm} * f_{scale} + t_{start} \quad \text{(Equation 2)}$$

where $t(\text{state}_k)$ is the starting time for a new state at a point in time k, $t_{setpointk}$ is the time of the previous state at time k, $t_{startk}$ is the time of the previous state at time k, $t_{norm}$ is the normalized time, $F_{scale}$ is the scale factor, and $t_{norm}$ is the start time.

Setpoint waveform streaming progenitor module 112 may thus use normalization and scaling to enable itself to function as a universal streaming setpoint waveform progenitor for arbitrarily different states and inputs, regardless of timing or amplitudes, and to generate setpoint waveforms of practically any shape. Setpoint waveform streaming progenitor module 112 may also avoid drawbacks of reference models of the prior art that lack the waveform control and shaping features of the present disclosure, and which are based on a second order linear system reference. Setpoint waveform streaming progenitor module 112 may thus avoid drawbacks of prior art reference models in which, for example, various parameters such as overshoot times and settling times cannot be directly controlled, but only indirectly incurred, often inaccurately and often inducing unwanted side effects such as ringing, in which the waveform oscillates about the setpoint rather than settling to it. Setpoint waveform streaming progenitor module 112 may thus avoid drawbacks of prior art reference models that sometimes excite unstable modes in strongly nonlinear and/or chaotic plasmas, which may often trap a plasma chamber in an unescapable limit cycle, or cause other debilitating or catastrophic malfunctions or failure modes.

Referring again to the example of FIG. 1, in some examples, setpoint control UI system 102 of setpoint waveform streaming system 100 may enable a user to specify desired setpoint levels with some averaging metric or metrics, and setpoint control UI system 102 may output those one or more averaging metrics to optional setpoint modifier module 114, which may optionally be included in some examples of setpoint waveform streaming system 100. Setpoint modifier module 114 may, based on these one or more metrics, automatically synthesize progenitor parameters and send those synthesized progenitor parameters to setpoint waveform streaming progenitor module 112, such that setpoint waveform streaming progenitor module 112 may attain and generate the desired metrics in realtime, based on the synthesized progenitor parameters generated and outputted by setpoint modifier module 114. Thus, setpoint modifier module 114 may be configured to output setpoint modifier information to setpoint waveform streaming progenitor module 112. Setpoint modifier module 114 and setpoint waveform streaming progenitor module 112 may both be comprised in pseudo-realtime processor 104, and setpoint modifier module 114 and setpoint waveform streaming progenitor module 112 may both be configured to receive inputs from setpoint control UI system 102. More description of examples of optional setpoint modifier module 114 may be found in co-pending patent application Ser. No. 17/494,383 of the identical applicant and inventor as the present disclosure.

Setpoint control UI system 102 may also enable a user to choose from among a variety of options for every state, and combine them together, in the specification data for a single desired setpoint waveform. Setpoint waveform streaming progenitor module 112 may, in response to the user inputs, implement the selected options and combinations for every state in generating a setpoint waveform. In particular, after a user enters inputs indicative of desired setpoint waveform shapes and parameters via setpoint control UI system 102, setpoint control UI system 102 may output those setpoint waveform shape and parameter inputs to distributed setpoint waveform streaming core system 130, and in particular first to setpoint waveform streaming progenitor module 112, running or executing on pseudo-realtime processor 104.

Setpoint waveform streaming progenitor module 112 may receive the user inputs specifying the desired setpoint waveform shapes and parameters from setpoint control UI system 102, and in response, may generate a seed waveform, in some examples. In generating the seed waveform, setpoint waveform streaming progenitor module 112 may use an optimized number of uniformly and/or non-uniformly sampled points, which may correspond to a number of points that may minimize regression or interpolation processing burden (and thus time and resources) in realtime processor 106 (e.g., an FPGA). The seed waveform generated by setpoint waveform streaming progenitor module 112 may correspond to points that define a whole single setpoint waveform pulse cycle for the next two interrupts of pseudo-realtime processor 104, and omitting any data that is repetitive or superfluous for constructing the setpoint waveform, in some examples. One interrupt may have a duration of around eight milliseconds (8 ms), in one illustrative example. Setpoint waveform streaming progenitor module 112 may transmit the set of seed waveform data to setpoint waveform streaming processing module 122.

Setpoint waveform streaming progenitor module 112 may also, in some examples, compare the user inputs indicative of the desired waveform with a reference waveform, and select sample points and an interpolation method that determine how the reference waveform is to be modified or deviated into the desired waveform. In some examples, this method may be conducive to forcing a nonlinearity to follow the desired waveform, and thereby counter the effects of this nonlinearity.

Setpoint waveform streaming progenitor module 112 may use interpolation methods including any of the following, as well as additional interpolation methods beyond those examples listed here:

nearest neighbor
next neighbor
previous neighbor
hold sample
linear
exponential
sum of sinusoids
Fourier series
cubic
Chebyshev polynomials
Hermite polynomials
Gaussian
Weibull
spline Thus, setpoint waveform streaming progenitor module 112 may use and specify, in a seed waveform tensor or tensorized seed waveform, or other waveform data package that setpoint waveform streaming progenitor module 112 generates and outputs, any of the following example interpolation methods, as well as any of a wide range of additional interpolation methods: setpoint waveform streaming progenitor module 112 may use and specify a nearest neighbor interpolation method, a next neighbor interpolation method, a previous neighbor interpolation method, a hold sample interpolation method, a linear interpolation method, an exponential interpolation method, a sum of sinusoids interpolation method, a Fourier series interpolation method, a cubic interpolation method, a Chebyshev polynomials interpolation method, a Hermite polynomials interpolation method, a Gaussian interpolation method, a Weibull interpolation method, a spline interpolation method, or any other applicable interpolation method, in various examples. Setpoint waveform streaming progenitor module 112 may also use and specify any applicable seed waveform points, and any interpolation parameters applicable to the selected interpolation method, to also include and specify in a seed waveform tensor or other waveform data package that setpoint waveform streaming progenitor module 112 generates and outputs and sends or transmits to setpoint waveform streaming processing module 122. The term "seed waveform" may be used to refer to a seed waveform data package, or a data package that contains, comprises, or constitutes data specifying or indicative of a seed waveform of this disclosure.

After setpoint waveform streaming progenitor module 112 generates the points, setpoint waveform streaming progenitor module 112 may combine the points together with corresponding interpolation parameters and an identifier or indicator of the selected interpolation method, in conjunction with the time waveform, in a tensorized seed waveform signal, or other waveform data package, that incorporate the foregoing information for the setpoint waveform. A "seed waveform tensor" may refer to a tensorized seed waveform signal, or the information for a seed waveform that setpoint waveform streaming progenitor module 112 may process into the form of a tensor, after which setpoint waveform streaming progenitor module 112 may generate and output a signal or transmission that physically encodes or embodies that tensor and the information represented by that tensor. Setpoint waveform streaming progenitor module 112 generates and sends a signal that may encode a tensorized seed waveform; description of sending a seed waveform tensor may not be intended to describe sending a pure mathematical tensor per se, as opposed to a physical signal encoding or representing such a tensor. While the tensor encoding the seed waveform may be at least a second-order tensor in various examples, setpoint waveform streaming progenitor module 112 may also encode the seed waveform information in a first-order or zeroth-order tensor in some examples. The waveform points, interpolation method, and interpolation parameters that setpoint waveform streaming progenitor module 112 packages together into a tensorized waveform signal to send to setpoint waveform streaming processing module 122 may contain all the data that may be necessary, at sufficient bandwidth, for setpoint waveform streaming processing module 122 to perform its functions (described below) to generate the desired setpoint waveform, up to the limits of resolution of which realtime processor 106 is capable, in various examples. Then, at the next communication interrupt between pseudo-realtime processor 104 and realtime processor 106 (e.g., once every 8 milliseconds in some examples), setpoint waveform streaming progenitor module 112 may send this tensorized setpoint waveform signal incorporating the seed waveform, interpolation parameters, and interpolation method identifier, to setpoint waveform streaming processing module 122.

Setpoint waveform streaming processing module 122 may receive the tensorized setpoint waveform signal from setpoint waveform streaming progenitor module 112, and may use the time data, cycle duration, amplitudes, and interpolation method, and/or other indicative data, of the setpoint waveform in tensorized form, to generate a full setpoint waveform, without needing to perform any reshaping or decompressing of the data from the tensorized setpoint waveform signal. Setpoint waveform streaming processing module 122 may implement full intrinsic and scalable parallel processing of the inputs and interpolations, enabling excellent processing performance and accuracy of control, particularly for desired setpoint waveforms comprising relatively more states and relatively more desired control inputs. Setpoint waveform streaming processing module 122 may use the indicated interpolation method and the timing of a single pulse to interpolate the seed waveform tensor over a uniform time grid corresponding to the control rate of realtime processor 106 (e.g., around 4.125 megahertz (MHz) in one example, or at higher or lower frequencies than this in some examples), and then shifted in time for each subsequent repetitive power cycle.

Setpoint waveform streaming processing module 122 may respond to interrupts of pseudo-realtime processor 104 by checking whether there are any new user inputs, indicating any changes in the desired setpoint waveform, and either update the data for the seed waveform in accordance with any new user inputs, or keep the same data for the seed waveform, if there are no new user inputs indicative of changes in the desired setpoint waveform. If the seed waveform data are kept the same, this may help enable pseudo-realtime processor 104 and realtime processor 106 to interleave some mathematical operations used for other purposes, thereby maximizing processing performance and minimizing processing resource usage. It is anticipated that in many applications, ongoing user updates to the desired setpoint waveform would occur in only a small minority of cases (e.g., 10% or fewer). In an example RF environment control application, distributed setpoint waveform streaming core system 130 may typically use a single setpoint waveform shape from when it receives a radio frequency on (RF-ON) signal, to initiate control of an RF generator, such as RF generator 252 of FIG. 2, and continue using the same setpoint waveform shape through until it receives a radio frequency off (RF-OFF) signal, to deactivate the RF generator. By typically using a single setpoint waveform shape, and enabling interleaving of mathematical operations, distributed setpoint waveform streaming core system 130 may enable substantial boosts to performance and resource usage of a realtime processor executing setpoint waveform streaming processing module 122, such as realtime processor 106 of FIG. 1 or realtime processor 206 of FIG. 2.

Figure 4:
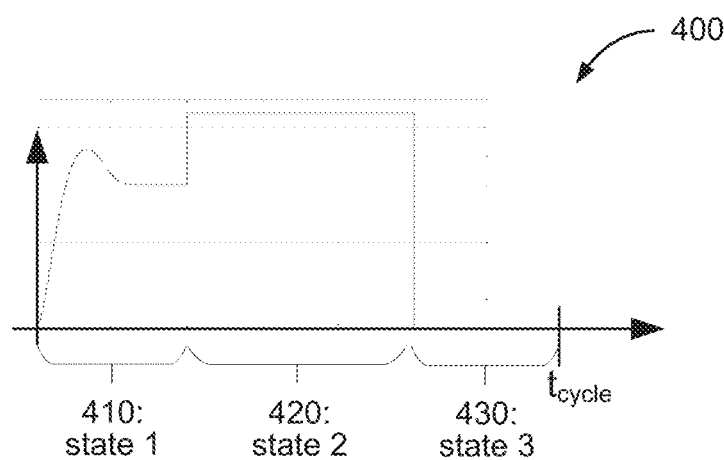
FIG. 4 shows a graph of a desired setpoint waveform indicated by user inputs, in accordance with an illustrative example
Figure 5:
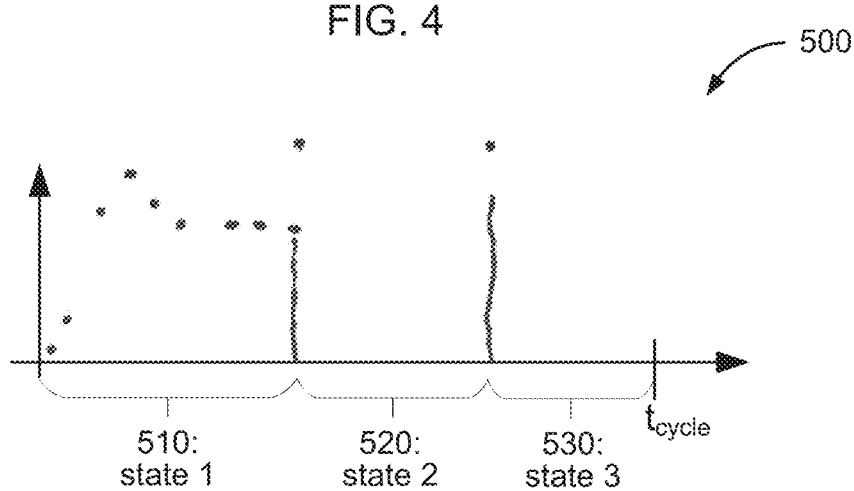
FIG. 5 shows a graph of a seed waveform, in accordance with an illustrative example.
Figure 6:
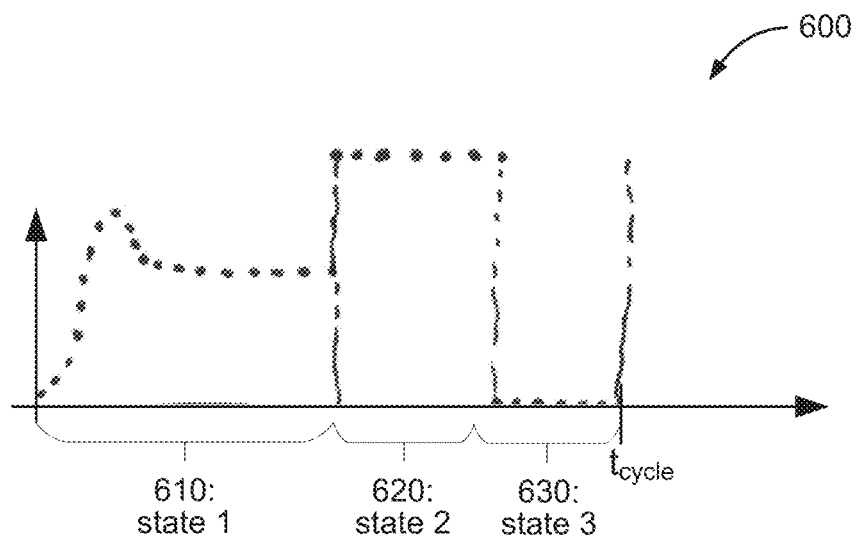
FIG. 6 shows a graph of a setpoint waveform, in accordance with an illustrative example.

FIGS. 4-6 show graph data for an example of a desired setpoint waveform indicated by user inputs (FIG. 4), and processing of the desired setpoint waveform by distributed setpoint waveform streaming core system 130 or 230 into a seed waveform (500) and then a full setpoint waveform (FIG. 6). FIG. 4 shows a graph of a desired setpoint waveform 400 indicated by user inputs, in accordance with an illustrative example, in which desired setpoint waveform 400 comprises three states: a first waveform state 1 (at 410) during a first time period of desired setpoint waveform 400, a second waveform state 2 (at 420) during a second first time period of desired setpoint waveform 400, and a third waveform state 3 (at 430) during a third first time period of desired setpoint waveform 400. This series of three sequential setpoint waveform states 410, 420, 430 may repeat indefinitely.

FIG. 5 shows a graph of a seed waveform 500 (in an illustrative conceptual depiction, not a precise graph), in accordance with an illustrative example. Setpoint waveform streaming progenitor module 112 of distributed setpoint waveform streaming core system 130, in the example of FIG. 1, may receive the user data indicative of desired setpoint waveform 400, and may process this user data to generate a seed waveform tensor comprising all the information necessary to specify seed waveform 500 shown in FIG. 5, comprising waveform points (as shown in seed waveform 500), an interpolation method specified for each state (not shown in FIG. 5), and interpolation parameters (not shown in FIG. 5). In this example, the waveform points are as shown in the graph of seed waveform 500; the interpolation methods per state may be indicated as spline interpolation for state 1 (at 510), nearest neighbor interpolation for state 2 (at 520), and nearest neighbor interpolation again for state 3 (at 530), as the respective states or pulsing levels are shown in FIG. 5. The interpolation parameters may comprise a specification of the duration of the time duration for the cycle time of the waveform, of 16 milliseconds, which may be approximately equal to two interrupt cycles, in this example.

Setpoint waveform streaming progenitor module 112 may send the data for seed waveform 500 to setpoint waveform streaming processing module 122. Setpoint waveform streaming progenitor module 112 (executed, for example, by a CPU) may send the data for seed waveform 500 in a form that may maximize or seek to maximize or promote information properties such as the information density, accuracy, and/or precision. Setpoint waveform streaming progenitor module 112 may send the data for seed waveform 500 in a form that may not be equally spaced in time, and may not be normalized, as these properties may not be important or as important in how setpoint waveform streaming progenitor module 112 packages the data for the seed waveform. Setpoint waveform streaming processing module 122 (executed, for example, by an FPGA) may process the data received for seed waveform 500 to generate setpoint waveform 600, as shown in FIG. 6, and may scale and interpolate the data, and may process the seed waveform data uniformly and in realtime, to generate a full waveform that accurately and precisely reproduces the desired waveform, including with normalization and with an evenly distributed and high time density of resolution.

FIG. 6 shows a graph of a setpoint waveform 600 (in an illustrative conceptual depiction, not a precise graph), in accordance with an illustrative example. As shown in FIG. 6, setpoint waveform streaming processing module 122 may generate setpoint streaming waveform 600 as a function of processing the waveform points, the interpolation methods, and the interpolation parameters sent to it by setpoint waveform streaming progenitor module 112. Setpoint waveform streaming progenitor module 112 may have included, in the seed waveform tensor or other form of waveform data package, indicators to use a spline interpolation method for state 1 of the setpoint waveform, and nearest neighbor interpolation method for both of states 2 and 3 of the setpoint waveform, as noted above with reference to FIG. 5. Setpoint waveform streaming processing module 122 may read or decode the seed waveform tensor or other waveform data package from setpoint waveform streaming progenitor module 112, and may determine from the information in the seed waveform tensor or other waveform data package to generate a setpoint waveform from the waveform points provided. Setpoint waveform streaming processing module 122 may apply spline interpolation with accompanying interpolation parameters to the waveform points in state 1 of the waveform (610), and apply nearest neighbor interpolation with accompanying interpolation parameters to the waveform points in both state 2 (620) and state 3 (630) of the setpoint waveform, as shown in FIG. 6, in accordance with the information from the seed waveform tensor or other waveform data package from setpoint waveform streaming progenitor module 112. Thus, the plurality of points, the interpolation method, and the or more interpolation parameters, comprised in the seed waveform tensor or other waveform data package generated by setpoint waveform streaming progenitor module 112, comprise sufficient information for waveform streaming processing module 122 to output a setpoint waveform, such that the setpoint waveform that setpoint waveform streaming processing module 122 outputs matches, to within a nominal resolution, the desired setpoint waveform as indicated by the inputs indicative of the desired setpoint waveform, as received (e.g., from a user) and conveyed by setpoint control UI system 102 to setpoint waveform streaming progenitor module 112.

Setpoint waveform streaming processing module 122 may also generate setpoint waveform state segments and full setpoint waveforms by processing interpolations in accordance with any of the interpolation methods listed above, or other interpolation methods, together with seed waveform points and interpolation parameters, as sent to setpoint waveform streaming processing module 122 by setpoint waveform streaming progenitor module 112, in other examples. Setpoint waveform streaming processing module 122 may generate setpoint waveform 600 in the form of a series of points at different amplitudes at different times, while setpoint waveform 600 may comprise a substantially greater time density of points than seed waveform 500. The quantization or time density of points of setpoint waveform 600 may match or conform to the desired setpoint waveform indicated by the original user inputs, as received via setpoint control UI system 102, within a nominal resolution, and may in some examples represent hardware limits of resolution with which a setpoint waveform may be generated by hardware to be controlled by setpoint waveform streaming system 100, such as RF generator 252 of FIG. 2, for example. In other contexts or other examples, a nominal resolution may further be considered as generally understood by persons skilled in the relevant fields of art.

Setpoint waveform streaming processing module 122 may generate setpoint waveform 600 repeated over time every time duration of the cycle of setpoint waveform 600, such as once every 16 milliseconds, as in the example indicated above. If setpoint waveform streaming processing module 122 doesn't receive an indication of a change in the desired setpoint waveform during an interrupt, setpoint waveform streaming processing module 122 may increase the repetition time to repeat the same setpoint waveform 600, such as to 24 milliseconds, for example. This repetition of setpoint waveform 600 may free up processing resources to execute other computationally intensive operations, in some examples. If setpoint waveform streaming processing module 122 does receive an indication of a change in the desired setpoint waveform during an interrupt, setpoint waveform streaming processing module 122 may restart the procedures described above to generate a new setpoint waveform in accordance with the newly received seed waveform, and specify and generate the new setpoint waveform beginning at the next interrupt. This generating of the new setpoint waveform may occupy computational resources of realtime processor 106, and may compete with other processes for those resources during that computational cycle.

Setpoint waveform streaming processing module 122 or 222 may thus generate and output setpoint waveform 600 to a control module of a controller, such as control module 224 of controller 203 in the example of FIG. 2. Setpoint waveform streaming processing module 122 or 222 may thus generate and output setpoint waveform 600 in an ongoing process with high resolution and rapid updating, and may thus output a streaming setpoint waveform, streamed to the control module of the controller, and thus implementing a realtime, streaming setpoint input to the control signal of the controller, in a robustly, freely, and arbitrarily shaped streaming setpoint waveform, in this example.

Figure 7:
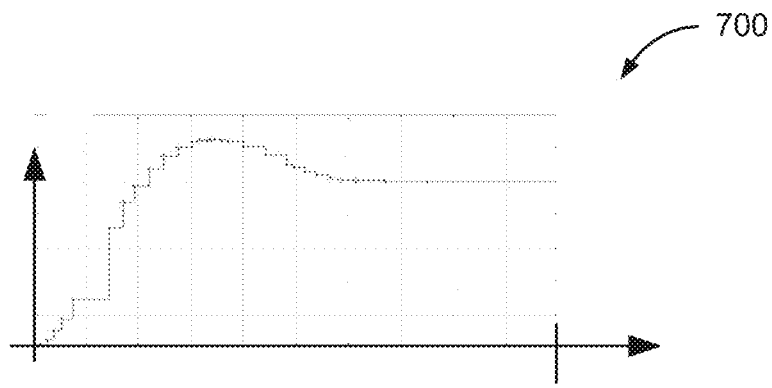
FIG. 7 shows a graph of a setpoint waveform, in accordance with another illustrative example.

FIG. 7 shows a graph of a setpoint waveform 700, in accordance with another illustrative example. While setpoint waveform 600 is an example of a linear interpolation of the seed waveform data used by a setpoint waveform streaming processing module to create it, a setpoint waveform streaming processing module may also use any of a number of other interpolation formats to generate and output a full waveform based on received seed waveform data. In some examples, the setpoint waveform streaming processing module may process incoming or received seed waveform data in accordance with a stairstep interpolation method, for example. Setpoint waveform 700 shown in FIG. 7 is an example of a complete waveform that setpoint waveform streaming processing module may generate by applying a stairstep interpolation method to a received seed waveform, based on receiving a stairstep interpolation parameter, and performing the most appropriate stairstep interpolation to the seed waveform data. In some examples, setpoint waveform 700 shown in FIG. 7 may be a waveform generated in accordance with a stairstep interpolation method based on the same seed waveform data used to generate waveform 300 of FIG. 3, whereas the difference is that waveform 300 is generated by a setpoint waveform streaming processing module using linear interpolation rather than stairstep interpolation. These are thus two examples of substantially different waveforms that setpoint waveform streaming processing module may generate from the same seed waveform using different interpolation methods, as may be indicated by an interpolation parameter. Many other different waveforms besides these two examples may also be generated from the same seed waveform by a setpoint waveform streaming processing module of this disclosure using other types of interpolation methods.

Figure 8:
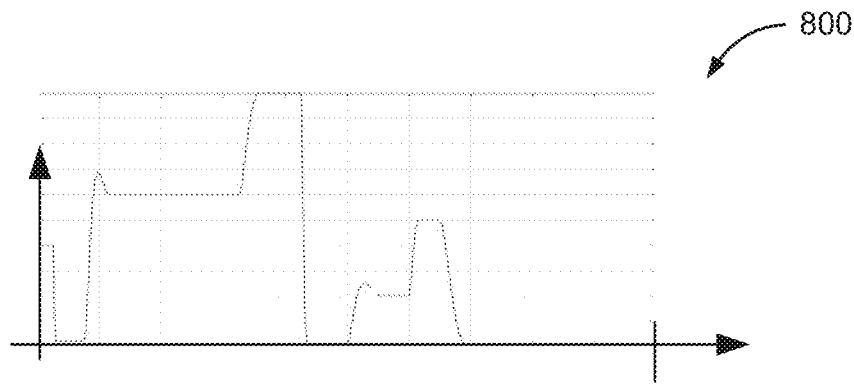
FIG. 8 shows a graph of a setpoint waveform, in accordance with another illustrative example.

FIG. 8 shows a graph of a setpoint waveform 800, in accordance with another illustrative example. Setpoint waveform 800 is another example setpoint waveform that a setpoint waveform streaming processing module of this disclosure may generate. Setpoint waveform 800 demonstrates additionally how a setpoint waveform streaming processing module of this disclosure may generate waveforms of any arbitrary shape. A setpoint waveform streaming processing module of this disclosure may generate waveforms that begin at a setpoint, below a setpoint, or above a setpoint, in any relation to the setpoint, and then may approach the setpoint with or without overshoot or undershoot, and may achieve other arbitrary behavior relative to the setpoint. Setpoint waveform 800 of FIG. 8 also demonstrates how a setpoint waveform streaming processing module of this disclosure may generate a waveform that begins under a setpoint, drops further below the setpoint, then rises exponentially and overshoots the setpoint, before settling onto the setpoint, before moving on to other states and other behavior in other states, in this illustrative example.

Figure 9:
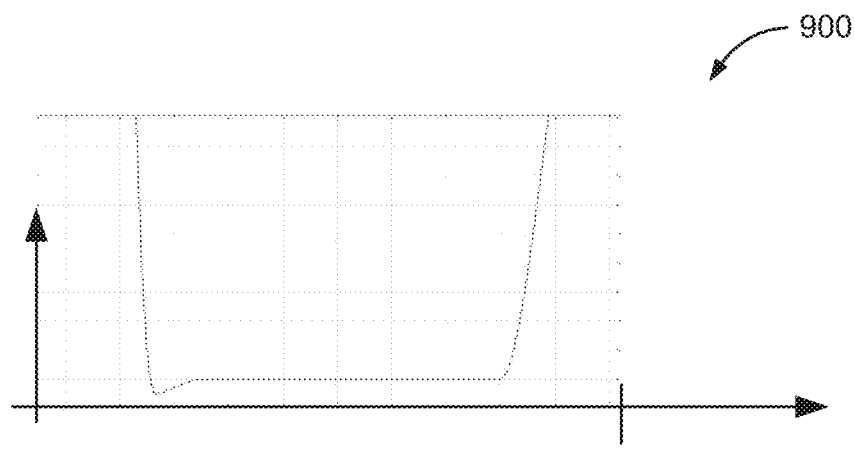
FIG. 9 shows a graph of a setpoint waveform, in accordance with another illustrative example.

FIG. 9 shows a graph of a setpoint waveform 900, in accordance with another illustrative example. Setpoint waveform 900 is another example setpoint waveform that a setpoint waveform streaming processing module of this disclosure may generate. Setpoint waveform 900 demonstrates another example of how a setpoint waveform streaming processing module of this disclosure may generate waveforms of any arbitrary shape. Setpoint waveform 900 demonstrates how a setpoint waveform streaming processing module of this disclosure may generate a waveform that begins above a setpoint, drops rapidly toward the setpoint and undershoots the setpoint, before settling upward toward the setpoint. Setpoint waveform 900 also demonstrates how a setpoint waveform streaming processing module of this disclosure may generate a waveform that concludes a state by exponentially rising above the setpoint for that state to a final value equal to the initial value, in accordance with this illustrative example. In each case among a wide variety of examples, a setpoint waveform streaming progenitor module (executed, for example, by a CPU), may send data for a seed waveform in a form that may maximize or seek to maximize or promote information properties such as the density, accuracy, and/or precision of the information for the desired waveform, and that may not be equally spaced in time or normalized, and a setpoint waveform streaming processing module (executed, for example, by an FPGA) may process the data received for the seed waveform to generate a setpoint waveform, and may scale and interpolate the data, which may process the seed waveform data, uniformly and in realtime, to generate a full waveform that accurately and precisely reproduces the desired waveform, including with normalization and with even and high resolution.

Figure 10:
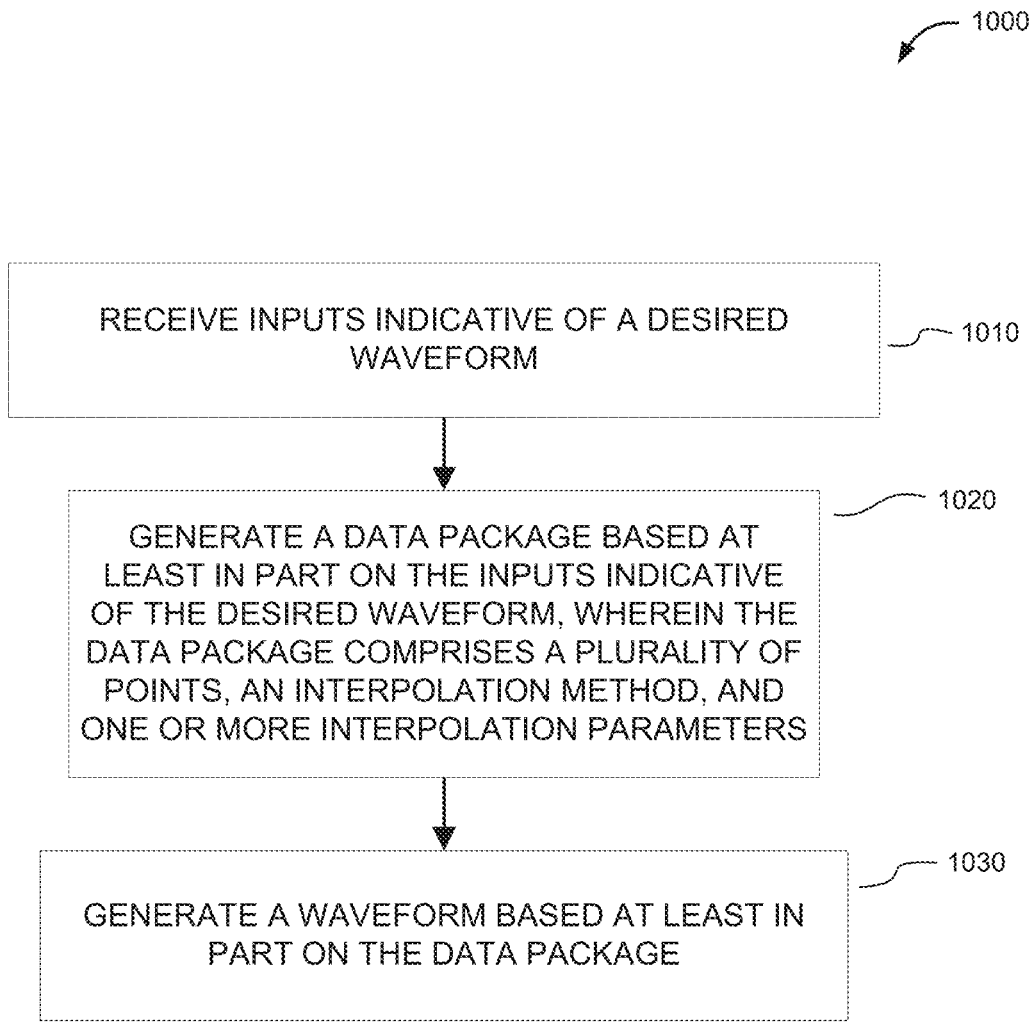
FIG. 10 depicts a flowchart for an example method for operation of a controller that may comprise a setpoint waveform streaming progenitor module and a setpoint waveform streaming processing module, in another aspect of the present disclosure.

FIG. 10 depicts a flowchart for an example method 1000 for operation of a controller, such as controller 203 of FIG. 2, or a controller that comprises setpoint waveform streaming progenitor module 112 and setpoint waveform streaming processing module 122 as in FIG. 1, in another aspect of the present disclosure. Method 1000 comprises receiving inputs indicative of a desired setpoint waveform (1010). Receiving inputs indicative of a desired setpoint waveform may be performed, executed, implemented, or embodied by setpoint waveform streaming progenitor module 112 executing on a CPU or other pseudo-realtime processor, or by another type of module or application executed by or on one or more CPUs or other pseudo-realtime processors, or other modules, applications, processors, devices, or systems, in various examples, and receiving inputs from a setpoint control UI system 102 or other system, module, device, or object for conveying inputs, in some examples. Method 1000 further comprises generating a data package based at least in part on the inputs indicative of the desired setpoint waveform, wherein the data package comprises a plurality of points, an interpolation method, and one or more interpolation parameters (1020). The data package may comprise a seed waveform tensor or other waveform data package, in various examples, and may be generated and outputted by setpoint waveform streaming progenitor module 112, in various examples. The data package may comprise any set of points indicative of any waveform possibly contemplated by an arbitrary user, and may comprise any type of interpolation method, including any of those indicated in this disclosure, or any other interpolation method, and may comprise any type of applicable interpolation parameters capable of functioning as parameters of the applicable interpolation method. "Comprising an interpolation method" will be understood by persons skilled in relevant fields of art to have a meaning that may include, comprising information indicative of an interpolation method. Method 1000 further comprises generating a setpoint waveform based at least in part on the data package (1030). Generating a setpoint waveform based at least in part on the data package may be performed by setpoint waveform streaming processing module 122, or other modules or applications executed by or on one or more FPGAs or other realtime processors, or other modules, applications, processors, devices, or systems, in various examples.

Figure 11:
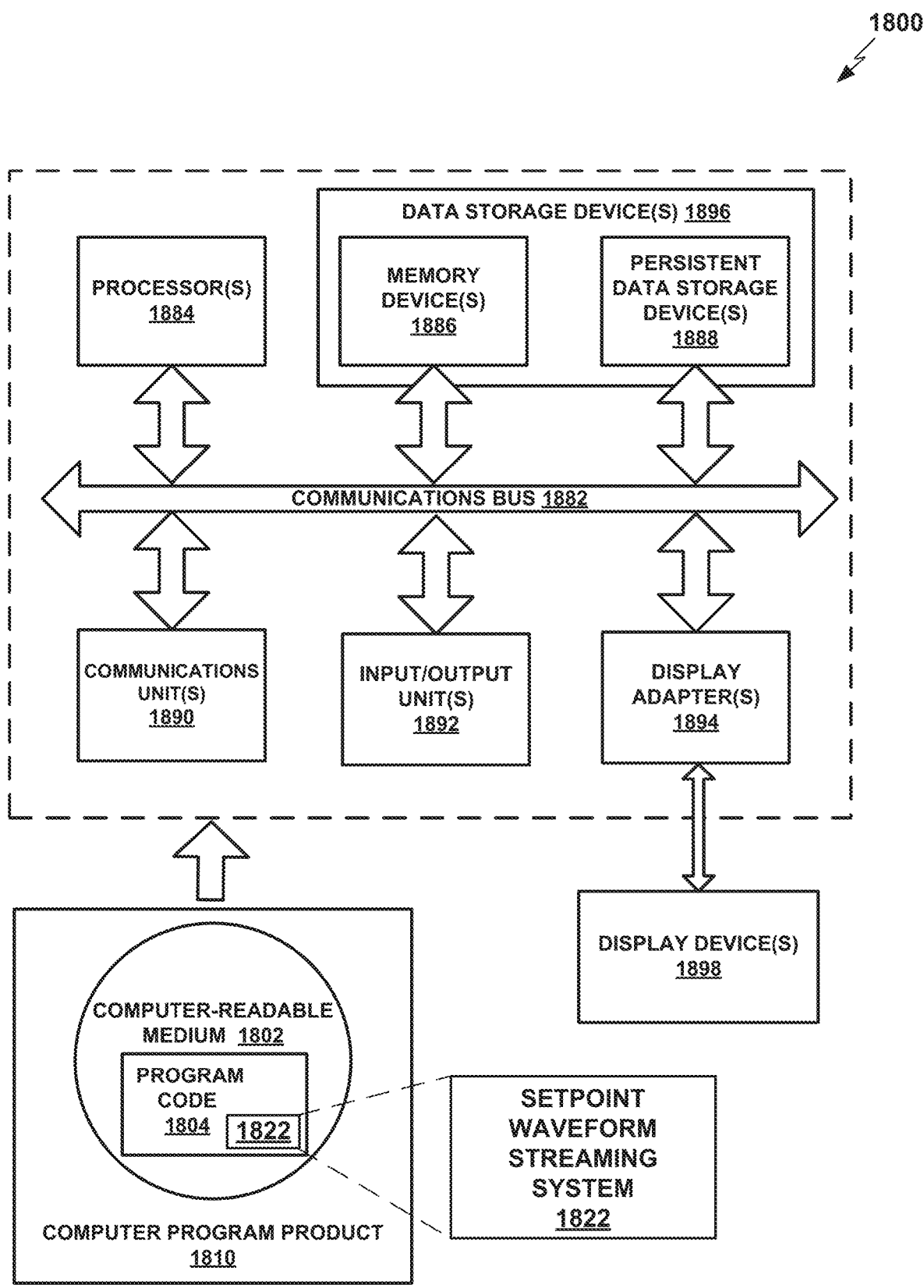
FIG. 11 depicts a block diagram of an example computing system that may embody, control, or execute any of various embodiments of a setpoint waveform streaming system, and other systems, methods, and apparatus disclosed herein, in various embodiments of this disclosure.

FIG. 11 depicts a block diagram of an example computing system 1800 that may embody, control, or execute any of various embodiments of a setpoint waveform streaming system 1822, and other systems, methods, and apparatus disclosed herein, in various embodiments of this disclosure. For example, computing system 1800 may serve as an embodiment of pseudo-realtime processor 104 and realtime processor 106 of FIG. 1, or controller 203 as depicted in FIG. 2, and as described above with reference thereto. As further examples, computing system 1800 may perform, execute, or embody any methods that generate waveforms 300, 400, 500, 600, 700, 800, and/or 900, as graphically depicted in FIGS. 3-9, and method 1000 as shown in FIG. 10, and as all respectively described above with reference thereto, as well as any other comparable methods, or methods that generate any other waveforms.

Computing system 1800 may be a server such as a web server or an application server. Computing system 1800 may also be any server for providing a setpoint waveform streaming application in various examples, including a virtual server that may be run from or incorporate any number of computing devices. A computing device may operate as all or part of a real or virtual server, and may be or incorporate a workstation, server, mainframe computer, notebook or laptop computer, desktop computer, tablet, smartphone, or other programmable data processing apparatus of any kind. Other implementations of a computing system 1800 may include a computer having capabilities or formats other than or beyond those described herein.

In the illustrative example of FIG. 18, computing system 1800 includes communications bus 1882, which provides communications between one or more processors 1884, one or more memory device(s) 1886, one or more persistent data storage device(s) 1888, one or more communications unit(s) 1890, and one or more input/output (I/O) unit(s) 1892. Communications bus 1882 may include a dedicated system bus, a general system bus, multiple buses arranged in hierarchical form, any other type of bus, bus network, switch fabric, or other interconnection technology. Communications bus 1882 supports transfer of data, commands, and other information between various subsystems of computing system 1800.

One or more processors 1884 may comprise a programmable central processing unit (CPU) configured for executing programmed instructions stored in one or more memory device(s) 1886. In another illustrative example, one or more processors 1884 may be implemented using one or more heterogeneous processor systems in which a main processor is present with secondary processors on a single chip. This may include a CPU and an FPGA on a single integrated circuit chip, or other examples of a pseudo-realtime processor and a realtime processor on a single chip, which may embody and function as an implementation of pseudo-realtime processor 104 and realtime processor 106 as depicted in FIG. 1, potentially also including additional processing devices, processing fabric, and/or other processing resources and other resources, for example. Computing system 1800 may also embody and function as an implementation of controller 200 of FIG. 2, in some examples. In another illustrative example, one or more processors 1884 may be a symmetric multi-processor system containing multiple processors of the same type. One or more processors 1884 may be a reduced instruction set computing (RISC) microprocessor, an x86 compatible processor, or any other suitable processor. In various examples, one or more processors 1884 may include a multi-core processor, for example. One or more processors 1884 may include multiple processing chips on one die, and/or multiple dies on one package or substrate, for example. One or more processors 1884 may also include one or more levels of integrated cache memory, for example. In various examples, one or more processors 1884 may comprise one or more CPUs distributed across one or more locations.

Data storage 1896 comprises one or more memory device(s) 1886 and one or more persistent data storage device(s) 1888, which are in communication with one or more processors 1884 through communications bus 1882. A memory device 1886 may comprise one or more random access semiconductor memory (RAM) devices for storing application data, i.e., computer program data, for processing. While memory device 1886 is conceptually depicted as a single monolithic block in FIG. 11, in various examples, memory device 1886 may be arranged in a hierarchy of caches and in other memory devices, in a single physical location, or distributed across a plurality of physical systems in various forms. While memory device 1886 is depicted physically separated from one or more processors 1884 and other elements of computing system 1800, memory device 1886 may refer equivalently to any intermediate or cache memory at any location throughout computing system 1800, including cache memory proximate to or integrated with one or more processors 1884 or individual processing cores of one or more processors 1884.

A persistent data storage device 1888 may include one or more hard disc drives, solid state drives, flash drives, rewritable optical disc drives, magnetic tape drives, or any combination of these or other data storage media. Persistent data storage device 1888 may store computer-executable instructions or computer-readable program code for an operating system, application files comprising program code, data structures or data files, and any other type of data. These computer-executable instructions may be loaded from persistent data storage device 1888 into memory device 1886 to be read and executed by one or more processors 1884 or other processors. Data storage 1896 may also include any other hardware elements capable of storing information, such as, for example and without limitation, data, program code in functional form, and/or other suitable information, either on a temporary basis and/or a permanent basis.

Persistent data storage device 1888 and memory device 1886 are examples of physical, tangible, non-transitory computer-readable data storage devices. Data storage 1896 may include any of various forms of volatile memory that may require being actively powered and periodically electrically refreshed to maintain data in memory, while those skilled in the art will recognize that this also constitutes an example of a physical, tangible, non-transitory computer-readable data storage device. Executable instructions may be stored on a non-transitory medium when program code is loaded, stored, relayed, buffered, or cached on a non-transitory physical medium or device, including if only for only a short duration or only in a volatile memory format; in these examples, any form of memory, data storage, buffer, cache, or any other device or type of memory or data storage mechanism of any duration may constitute a physical, tangible, non-transitory computer-readable medium comprising computer-executable instructions embodying and/or implementing examples of the present disclosure.

One or more processors 1884 can be suitably programmed to read, load, and execute computer-executable instructions and/or computer-readable program code for a setpoint waveform streaming system 1822, as described in greater detail above. For purposes of this disclosure, the term "program code" may comprise computer-executable instructions. This program code may be stored on memory device 1886, persistent data storage device 1888, or elsewhere in computing system 1800. This program code may also take the form of executable program code 1804 stored on computer-readable medium 1802 comprised in computer program product 1810, and may be transferred or communicated, through any of a variety of local or remote means, from computer program product 1810 to computing system 1800 to be enabled to be executed by one or more processors 1884, as further explained below.

The operating system may provide functions such as device interface management, memory management, and multiple task management. The operating system can be a Unix-based operating system, a non-Unix based operating system, a network operating system, a real-time operating system (RTOS), or any other suitable operating system. One or more processors 1884 can be suitably programmed to read, load, and execute instructions of the operating system.

A communications unit 1890, in this example, provides for communications with other computing or communications systems or devices. Communications unit 1890 may provide communications through the use of physical and/or wireless communications links. Communications unit 1890 may include a network interface card for interfacing with a local area network (LAN), an Ethernet adapter, a Token Ring adapter, a modem for connecting to a transmission system such as a telephone line, or any other type of communication interface. Communications unit 1890 may be used for operationally connecting many types of peripheral computing devices to computing system 1800, such as printers, bus adapters, and other computers. Communications unit 1890 may be implemented as an expansion card or be built into a motherboard, for example.

An input/output unit 1892 can support devices suited for input and output of data with other devices that may be connected to computing system 1800, such as keyboard, a mouse or other pointer, a touchscreen interface, an interface for a printer or any other peripheral device, a removable magnetic or optical disc drive (including CD-ROM, DVD-ROM, or Blu-Ray), a universal serial bus (USB) receptacle, or any other type of input and/or output device. Input/output unit 1892 may also include any type of interface for video output in any type of video output protocol and any type of monitor or other video display technology, in various examples. Some of these examples may overlap with each other, or with example components of communications unit 1890 or data storage 1896. Input/output unit 92 may also include appropriate device drivers for any type of external device, or such device drivers may reside elsewhere on computing system 1800 as appropriate.

Computing system 1800 also includes a display adapter 1894 in this illustrative example, which provides one or more connections for one or more display devices, such as display device 1898, which may include any of a variety of types of display devices. Some of these examples may overlap with example components of communications unit 1890 or input/output unit 1892. Input/output unit 1892 may also include appropriate device drivers for any type of external device, or such device drivers may reside elsewhere on computing system 1800 as appropriate. Display adapter 1894 may include one or more video cards, one or more graphics processing units (GPUs), one or more video-capable connection ports, or any other type of data connector capable of communicating video data, in various examples. Display device 1898 may be any kind of video display device, such as a monitor, a television, or a projector, in various examples.

Input/output unit 1892 may include a drive, socket, or outlet for receiving computer program product 1810, which comprises a tangible, non-transitory computer-readable medium 1802 having executable program code 1804 stored thereon. For example, computer program product 1810 may be a CD-ROM, a DVD-ROM, a Blu-Ray disc, a magnetic disc, a USB stick, a flash drive, or an external hard disc drive, as illustrative examples, or any other suitable data storage technology.

Computer-readable medium 1802 may include any type of optical, magnetic, or other physical medium that physically encodes executable program code 1804 as a binary series of different physical states in each unit of memory that, when read by computing system 1800, induces a physical signal that is read by one or more processors 1884 that corresponds to the physical states of the basic data storage elements of computer-readable medium 1802, and that induces corresponding changes to the physical state of one or more processors 1884. That physical program code signal may be modeled or conceptualized as computer-readable instructions at any of various levels of abstraction, such as a high-level programming language, assembly language, or machine language, but ultimately constitutes a series of electrical and/or magnetic interactions that physically induce a change in the physical state of one or more processors 1884, thereby physically reconfiguring one or more processors 1884 and causing or configuring one or more processors 1884 to generate physical outputs that correspond to the computer-executable instructions, in a way that causes computing system 1800 to physically assume new capabilities that it did not have until its physical state was changed by loading the executable instructions comprised in executable program code 1804.

In some illustrative examples, executable program code 1804 may be downloaded over a network to data storage 1896 from another device or computer system for use within computing system 1800. Executable program code 1804 comprising computer-executable instructions may be communicated or transferred to computing system 1800 from computer-readable medium 1802 through a hard-line or wireless communications link to communications unit 1890 and/or through a connection to input/output unit 1892. Computer-readable medium 1802 comprising executable program code 1804 may be located at a separate or remote location from computing system 1800, and may be located anywhere, including at any remote geographical location anywhere in the world or in orbit, and may relay executable program code 1804 to computing system 1800 over any type of one or more communication links, such as the Internet and/or other packet data networks. Executable program code 1804 may be transmitted over a wireless Internet connection, or over a shorter-range direct wireless connection such as wireless LAN, Bluetooth™, Wi-Fi™, or an infrared connection, for example. Any other wireless or remote communication protocol may also be used in other implementations.

The communications link and/or the connection may include wired and/or wireless connections in various illustrative examples, and executable program code 1804 may be transmitted from a source computer-readable medium 1802 over non-tangible media, such as communications links or wireless transmissions containing the executable program code 1804. Executable program code 1804 may be more or less temporarily or durably stored on any number of intermediate tangible, physical computer-readable devices and media, such as any number of physical buffers, caches, main memory, or data storage components of servers, gateways, network nodes, mobility management entities, or other network assets, en route from its original source medium to computing system 1800.

Various example embodiments of this disclosure may be in the form of a system, a method, and/or a computer program product. The computer program product may include a computer readable storage medium (or media) having computer readable program instructions thereon for causing a processor to carry out aspects of embodiments of this disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, any suitable combination of the foregoing, any other type of storage device, or any combination of any of the foregoing with any other system. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including object-oriented programming languages such as C++ or Java; imperative programming languages, such as C; a specialized language such as hardware description language (HDL); Lisp programming languages, such as Common Lisp, Racket, or Clojure; other functional programming languages, such as Haskell or Erlang; or multi-paradigm languages, such as Python or Rust. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider (ISP)). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of embodiments of this disclosure.

Aspects of the present disclosure are described herein with reference to flowchart illustrations and/or block diagrams of methods, apparatus (systems), and computer program products according to examples of the disclosure. Each block of the flowchart illustrations and/or block diagrams, and combinations of blocks in the flowchart illustrations and/or block diagrams, can be implemented by computer-readable and/or computer-executable program instructions.

These computer-readable and/or computer-executable program instructions may be provided to one or more processors of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable and/or computer-executable program instructions may also be stored in a computer readable storage medium that can direct a computer, a programmable data processing apparatus, and/or other devices to function in a particular manner, such that the computer-readable storage medium having instructions stored thereon comprises an article of manufacture that comprises instructions which implement aspects of the function/act specified in the flowchart and/or block diagram block or blocks. The computer-readable and/or computer-executable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions, acts, or steps specified in the flowchart and/or block diagram block or blocks.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some implementations, the functions noted in the block may occur in a different order than that noted in the figures. For example, two blocks shown in succession in a particular example depicted in a particular figure may, in fact, be executed substantially concurrently, or the blocks may sometimes be executed in the reverse order, or in an overlapping order, depending upon the functionality involved. Each block of the block diagrams and/or flowchart illustration, and combinations of blocks in the block diagrams and/or flowchart illustration, may also be implemented by special purpose hardware-based systems that perform the specified functions or acts or carry out combinations of special purpose hardware and computer instructions.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Persons of skill in the relevant fields of art may implement the described functionality in varying ways for each particular application, but any such particular implementation decisions an details do not cause, constitute, or imply a departure from the scope of the present invention.

The various illustrative logical blocks, modules, and circuits described in connection with the embodiments disclosed herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, or any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Figure 12:
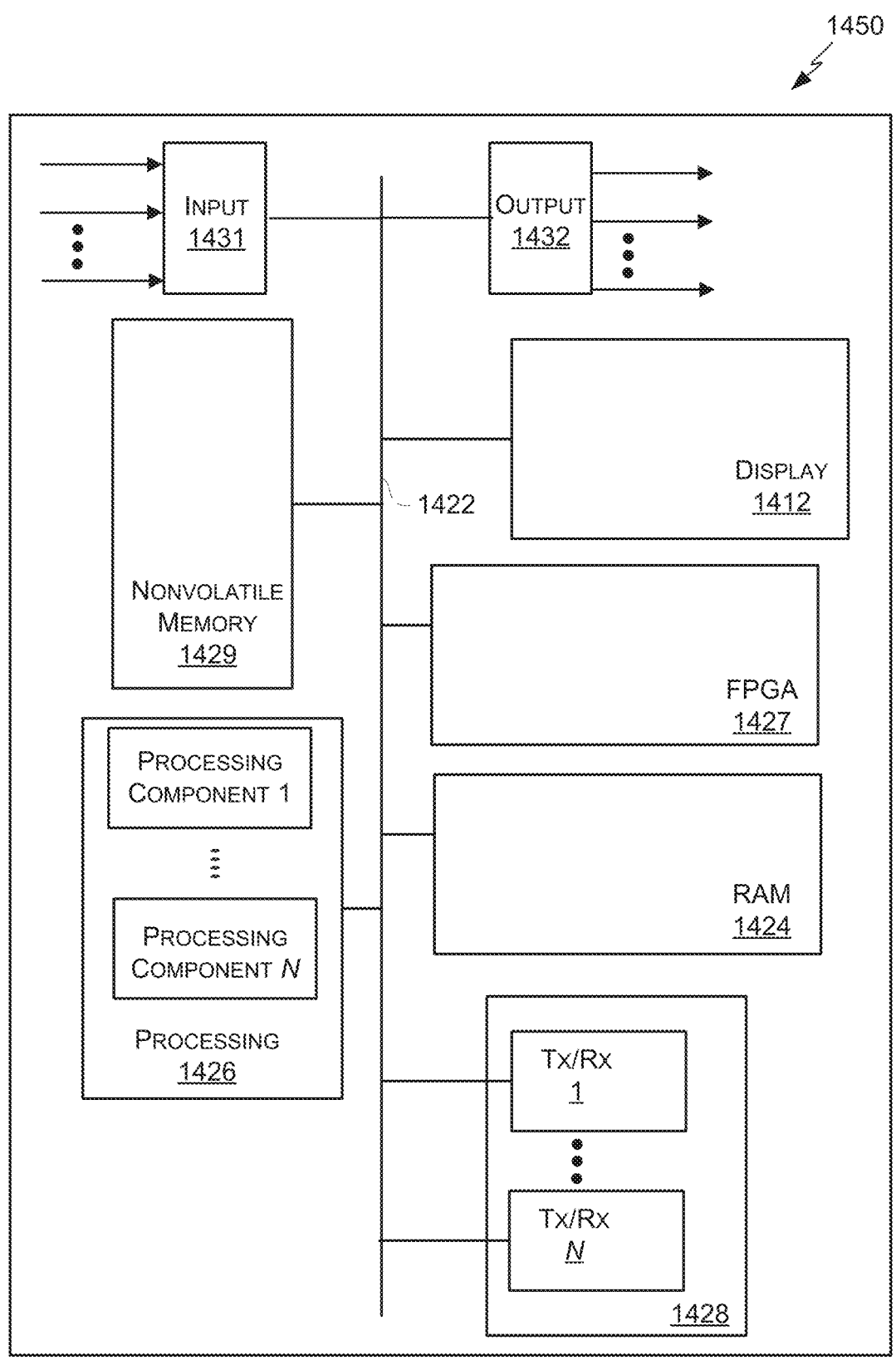
FIG. 12 depicts a conceptual block diagram of example physical components that may perform, execute, or embody one or more aspects of various embodiments of a setpoint waveform streaming system, and other systems, methods, and apparatus disclosed herein, in various aspects of the present disclosure.

FIG. 12 depicts a conceptual block diagram of example physical components that may perform, execute, or embody one or more aspects of various embodiments of a setpoint waveform streaming system, and other systems, methods, and apparatus disclosed herein, in various aspects of the present disclosure. As shown, in this embodiment a display 1412 and nonvolatile memory 1429 are coupled to a bus 1422 that is also coupled to random access memory ("RAM") 1424, a processing portion (which includes N processing components) 1426, a field programmable gate array (FPGA) 1427, and a transceiver component 1428 that includes N transceivers. Although the components depicted in FIG. 12 represent physical components, FIG. 12 is not intended to be a detailed hardware diagram; thus, many of the components depicted in FIG. 12 may be realized by common constructs or distributed among additional physical components. Moreover, other existing and yet-to-be developed physical components and architectures may also be utilized to implement the functional components described with reference to FIG. 12.

A display 1412 generally operates to provide a user interface for a user, and in several implementations, display 1412 is realized by a touchscreen display. For example, display 1412 can be used to control and interact with the components described herein. In general, nonvolatile memory 1429 is non-transitory memory that functions to store (e.g., persistently store) data and machine readable (e.g., processor executable) code (including executable code that is associated with effectuating the methods described herein). In some embodiments, for example, nonvolatile memory 1429 includes bootloader code, operating system code, file system code, and non-transitory processor-executable code to facilitate the execution of the methods described herein.

In some implementations, nonvolatile memory 1429 may be realized by flash memory (e.g., NAND or ONENAND memory). In other examples, other memory types may be utilized as well. Although some examples may execute the code from the nonvolatile memory 1429, in other examples, the executable code in the nonvolatile memory may typically be loaded into RAM 1424 and executed by one or more of the N processing components in the processing portion 1426.

In operation, the N processing components in connection with RAM 1424 may generally operate to execute the instructions stored in nonvolatile memory 1429 to realize the functionality of the setpoint waveform streaming system described herein. For example, non-transitory processor-executable instructions to effectuate the methods described herein may be persistently stored in nonvolatile memory 1429 and executed by the N processing components in connection with RAM 1424. Processing portion 1426 may include a video processor, digital signal processor (DSP), graphics processing unit (GPU), and other processing components.

In addition, or in other examples, the field programmable gate array (FPGA) 1427 may be configured to effectuate one or more aspects of the methodologies described herein. For example, non-transitory FPGA-configuration-instructions may be persistently stored in nonvolatile memory 1429 and accessed by the FPGA 1427 (e.g., during boot up) to configure the FPGA 1427.

The input component 1431 may generally operate to receive signals (e.g., from a setpoint control UI system as described above). The output component 1432 may generally operate to provide one or more digital and/or analog signals (e.g., to a control module as described herein) to effectuate operational aspects of a setpoint waveform streaming system, and/or other system described herein.

The depicted transceiver component 1428 includes N transceiver chains, which may be used for communicating with external devices (e.g., external controllers) via wireless or wireline networks. Each of the N transceiver chains may represent a transceiver associated with a particular communication scheme (e.g., WiFi, Ethernet, Profibus, etc.).

Method 1000 and other methods of this disclosure may include other steps or variations in various other embodiments. Some or all of any of method 1000 may be performed by or embodied in hardware, and/or performed or executed by a controller, a CPU, an FPGA, a SoC, a measurement and control multi-processor system on chip (MPSoC), which may include both a CPU and an FPGA, and other elements together in one integrated SoC, or other processing device or computing device processing executable instructions, in controlling other associated hardware, devices, systems, or products in executing, implementing, or embodying various subject matter of the method.

Setpoint waveform streaming systems, devices, and methods are thus shown and described herein, in various foundational aspects and in various selected illustrative applications, architectures, techniques, and methods for setpoint waveform streaming. Persons skilled in the relevant fields of art will be well-equipped by this disclosure with an understanding and an informed reduction to practice of a wide panoply of further applications, architectures, techniques, and methods for setpoint waveform streaming encompassed by the present disclosure and by the claims set forth below.

As used herein, the recitation of "at least one of A, B and C" is intended to mean "either A, B, C or any combination of A, B and C." The descriptions of the disclosed examples are provided to enable any person skilled in the relevant fields of art to understand how to make or use the subject matter of the present disclosure. Various modifications to these embodiments will be readily apparent to those skilled in the art based on the present disclosure, and the generic principles defined herein may be applied to other examples without departing from the spirit or scope of the disclosure. Thus, the present disclosure is not limited to the embodiments shown herein but is to be accorded the widest scope consistent with the principles and novel features disclosed herein.

The present disclosure and many of its attendant advantages will be understood by the foregoing description, and various changes may be made in the form, construction, and arrangement of the components without departing from the disclosed subject matter or without sacrificing all of its material advantages. The form described is merely explanatory, and the following claims encompass and include a wide range of embodiments, including a wide range of examples encompassing any such changes in the form, construction, and arrangement of the components as described herein.

While the present disclosure has been described with reference to various examples, it will be understood that these examples are illustrative and that the scope of the disclosure is not limited to them. All subject matter described herein are presented in the form of illustrative, non-limiting examples, and not as exclusive implementations, whether or not they are explicitly called out as examples as described. Many variations, modifications, and additions are possible within the scope of the examples of the disclosure. More generally, examples in accordance with the present disclosure have been described in the context of particular implementations. Functionality may be separated or combined in blocks differently in various examples of the disclosure or described with different terminology, without departing from the spirit and scope of the present disclosure and the following claims. These and other variations, modifications, additions, and improvements may fall within the scope of the disclosure as defined in the claims that follow.

What is claimed is:

1. A system comprising:
    a setpoint waveform streaming progenitor module, configured to receive inputs indicative of a desired setpoint waveform, and to output a data package based at least in part on the inputs indicative of the desired setpoint waveform, wherein the data package comprises a plurality of points, information indicative of an interpolation method, and one or more interpolation parameters; and
    a setpoint waveform streaming processing module, configured to receive the data package from the setpoint waveform streaming progenitor module, and to output a streaming setpoint waveform based at least in part on the data package; and
    a first processor that operates at a first response processing speed for processing responses to inputs; and
    a second processor that operates at a second response processing speed for processing responses to inputs, that is faster than the first response processing speed,
    wherein the setpoint waveform streaming progenitor module is configured to execute on the first processor, and
    wherein the setpoint waveform streaming processing module is configured to execute on the second processor.

2. The system of claim 1, wherein the first processor comprises a pseudo-realtime processor, and the second processor comprises a realtime processor.

3. The system of claim 2, further comprising a controller, wherein the pseudo-realtime processor and the realtime processor are both comprised in the controller.

4. The system of claim 3, wherein the controller is comprised in a radio frequency (RF) generator that also comprises an RF amplifier, and wherein the controller is configured to output control signals based at least in part on the streaming setpoint waveform to the RF amplifier.

5. The system of claim 4, wherein the RF generator is configured to drive an RF load comprising a plasma processing chamber, based at least in part on the streaming setpoint waveform.

6. The system of claim 1, wherein the first processor comprises a CPU, and the second processor comprises an FPGA.

7. The system of claim 1, wherein the setpoint waveform streaming processing module is configured to output the setpoint waveform to a control module.

8. The system of claim 7, further comprising a realtime processor, wherein the setpoint waveform streaming processing module and the control module are both configured to execute on the realtime processor.

9. The system of claim 1, wherein the plurality of points, the interpolation method, and the or more interpolation parameters comprise sufficient information for the setpoint waveform streaming processing module to output the setpoint waveform such that the setpoint waveform matches the desired setpoint waveform as indicated by the inputs indicative of the desired setpoint waveform, to within a nominal resolution.

10. The system of claim 1, wherein the interpolation method comprises at least one of a nearest neighbor interpolation method, a next neighbor interpolation method, a previous neighbor interpolation method, a hold sample interpolation method, a linear interpolation method, an exponential interpolation method, a sum of sinusoids interpolation method, a Fourier series interpolation method, a cubic interpolation method, a Chebyshev polynomials interpolation method, a Hermite polynomials interpolation method, a Gaussian interpolation method, a Weibull interpolation method, and a spline interpolation method.

11. The system of claim 1, wherein the setpoint waveform streaming progenitor module is configured to receive inputs from a setpoint control user interface system.

12. The system of claim 1, further comprising a setpoint modifier module, wherein the setpoint modifier module is configured to output setpoint modifier information to the setpoint waveform streaming progenitor module.

13. The system of claim 12, further comprising a pseudo-realtime processor, wherein the setpoint modifier module and the setpoint waveform streaming progenitor module are both comprised in the pseudo-realtime processor, and wherein the setpoint modifier module and the setpoint waveform streaming progenitor module are both configured to receive inputs from a setpoint control user interface system.

14. A system comprising:
a setpoint waveform streaming progenitor module, configured to receive inputs indicative of a desired setpoint waveform, and to output a data package based at least in part on the inputs indicative of the desired setpoint waveform, wherein the data package comprises a plurality of points, information indicative of an interpolation method, and one or more interpolation parameters; and
a setpoint waveform streaming processing module, configured to receive the data package from the setpoint waveform streaming progenitor module, and to output a streaming setpoint waveform based at least in part on the data package; and
wherein the plurality of points, the interpolation method, and the one or more interpolation parameters comprise sufficient information for the setpoint waveform streaming processing module to output the setpoint waveform such that the setpoint waveform matches the desired setpoint waveform as indicated by the inputs indicative of the desired setpoint waveform, to within a nominal resolution.

15. The system of claim 14, further comprising:
a first processor that operates at a first response processing speed for processing responses to inputs; and
a second processor that operates at a second response processing speed for processing responses to inputs, that is faster than the first response processing speed,
wherein the setpoint waveform streaming progenitor module is configured to execute on the first processor, and
wherein the setpoint waveform streaming processing module is configured to execute on the second processor.

16. The system of claim 15, wherein the first processor comprises a pseudo-realtime processor, and the second processor comprises a realtime processor.

17. A system comprising:
a setpoint waveform streaming progenitor module, configured to receive inputs indicative of a desired setpoint waveform, and to output a data package based at least in part on the inputs indicative of the desired setpoint waveform, wherein the data package comprises a plurality of points, information indicative of an interpolation method, and one or more interpolation parameters; and
a setpoint waveform streaming processing module, configured to receive the data package from the setpoint waveform streaming progenitor module, and to output a streaming setpoint waveform based at least in part on the data package; and
wherein the interpolation method comprises at least one of a nearest neighbor interpolation method, a next neighbor interpolation method, a previous neighbor interpolation method, a hold sample interpolation method, a linear interpolation method, an exponential interpolation method, a sum of sinusoids interpolation method, a Fourier series interpolation method, a cubic interpolation method, a Chebyshev polynomials interpolation method, a Hermite polynomials interpolation method, a Gaussian interpolation method, a Weibull interpolation method, and a spline interpolation method.

18. The system of claim 17, further comprising:
a first processor that operates at a first response processing speed for processing responses to inputs; and
a second processor that operates at a second response processing speed for processing responses to inputs, that is faster than the first response processing speed,
wherein the setpoint waveform streaming progenitor module is configured to execute on the first processor, and
wherein the setpoint waveform streaming processing module is configured to execute on the second processor.

19. The system of claim 17, wherein the first processor comprises a pseudo-realtime processor, and the second processor comprises a realtime processor.

20. The system of claim 17, wherein the first processor comprises a CPU, and the second processor comprises an FPGA.

* * * * *